United States Patent [19]

Lundberg

[11] 4,349,407
[45] Sep. 14, 1982

[54] METHOD OF FORMING SINGLE CRYSTALS OF BETA SILICON CARBIDE USING LIQUID LITHIUM AS A SOLVENT

[75] Inventor: Lynn B. Lundberg, Los Alamos, N. Mex.

[73] Assignee: The United States of America as represented by the United States Department of Energy, Washington, D.C.

[21] Appl. No.: 37,247

[22] Filed: May 9, 1979

[51] Int. Cl.$^3$ ............................................. C30B 9/10
[52] U.S. Cl. .................................................. 156/624
[58] Field of Search ....... 156/624, DIG. 64, DIG. 71, 156/621, 623 R; 148/1.5; 252/62.3

[56] References Cited

U.S. PATENT DOCUMENTS

| | | | |
|---|---|---|---|
| 2,996,456 | 8/1961 | Hergenrother | 156/624 |
| 3,205,101 | 9/1965 | Mlavsky | 252/62.3 C |
| 3,278,274 | 10/1966 | Liebmann et al. | 156/624 |
| 3,669,763 | 6/1972 | Perusek | 252/62.3 C |
| 3,956,032 | 5/1976 | Powell et al. | 252/62.3 L |
| 4,032,371 | 6/1977 | Andersen | 252/62.3 C |

OTHER PUBLICATIONS

Pellegrini et al., Silicon Carbide–1973 Ed. Marshall, pp. 161–167, U.S.C. Press, Columbia S.C. 1974.

*Primary Examiner*—Hiram Bernstein
*Attorney, Agent, or Firm*—Edward C. Walterscheid; Paul D. Gaetjens; James E. Denny

[57] ABSTRACT

A method of growing single crystals of beta SiC from solution using molten lithium as a solvent for polycrystalline SiC feed material. Reasonable growth rates are accomplished at temperatures in the range of about 1330° C. to about 1500° C.

4 Claims, No Drawings

METHOD OF FORMING SINGLE CRYSTALS OF BETA SILICON CARBIDE USING LIQUID LITHIUM AS A SOLVENT

The invention described herein relates to a method of forming single crystals of silicon carbide, and more particularly to a method of forming single crystals of beta silicon carbide using liquid lithium as a solvent. It is a result of a contract with the Department of Energy.

BACKGROUND OF THE INVENTION

Silicon carbide has many useful features not found in various other semiconductor materials. In particular, its refractory nature, inertness, and high energy gap allow high power dissipation and superior reliability. It has several crystalline forms including the cubic or beta form.

The economic fabrication of various semiconductor elements requires the use of relatively large and homogeneous SiC monocrystals otherwise known as single crystals. They make use of both vapor phase (including chemical vapor) deposition and liquid phase deposition. The art teaches the use of molten silicon as a solvent for liquid-phase deposition of SiC single crystals, but unfortunately the solubility of SiC in silicon is quite low at any temperature that might heretofore have been considered reasonable, e.g., less than 2000° C.

Heretofore at least, a preferred solvent has been chromium, although the rare earths have also been used. Thus, for example, U.S. Pat. Nos. 2,996,456 and 3,278,274 teach the use of chromium as a solvent in the growth of SiC single crystals. The temperature required in both instances is said to be 1700° C. or higher. There is no indication in either patent as to what form of SiC is produced.

More recently, alloys or compounds of the transition metals and silicon have been used as solvents for the liquid-phase production of SiC single crystals. Using Ti-Si alloys, the growth temperature is in the range of 1600° to 1700° C. See P. W. Pellegrini and J. M. Feldman, "LPE Growth of SiC Using Transition Metal-Silicon Solvents," in *Silicon Carbide*—1973 edited by Marshall et al., pp. 161-167 (University of South Carolina Press, Columbia, S.C. 1974).

The cost of production of SiC single crystals can be materially reduced if the temperature at which the single crystals are formed can be lowered substantially. This also permits the use of a greater variety of crucible materials.

Accordingly, it is an object of this invention to provide a method for the liquid-phase growth of SiC single crystals.

It is another object of this invention to provide a method for the liquid-phase growth of SiC single crystals at a temperature substantially less than 1600° C.

A further object of the invention is to provide a method for the liquid-phase growth of beta SiC single crystals using a novel metal solvent.

SUMMARY OF THE INVENTION

I have found that SiC single crystals may readily be grown from the liquid phase using molten lithium as a solvent. The speed at which the crystals can be grown is dependent on the temperature of the solution, but reasonable growth rates are readily achieved by maintaining the solution at a temperature in the range of about 1330° C. to about 1500° C. In a preferred embodiment, beta SiC single crystals are formed by holding an excess of polycrystalline SiC in contact with the molten lithium at a temperature at which the polycrystalline SiC dissolves therein and maintaining the resultant solution at this temperature for a time sufficient for beta SiC single crystals of the desired size to precipitate therefrom.

DESCRIPTION OF THE PREFERRED EMBODIMENT

Molten lithium serves as an excellent solvent for SiC. The rate at which SiC dissolves in lithium is dependent on the temperature of the solution. By maintaining an excess of SiC feed material in contact with the liquid lithium a solution zone of lithium saturated with SiC can be obtained. As a result, as SiC continues to dissolve into the liquid lithium from the feed material, single crystals of SiC precipitate from the solution. These single crystals continue to grow as long as the equilibrium conditions are maintained.

To achieve a reasonable rate of growth of the single crystals, it is desirable that the temperature of the liquid lithium be maintained somewhat in excess of 1300° C. Although liquid lithium boils at 1317° C., this presents no significant problem. It should be borne in mind that solution of the SiC in the lithium raises the boiling point, but even if a significant amount of lithium vapor is formed at the temperature of interest, the vapor can readily be refluxed around the feed material. All that is required is that the crucible in which the liquid lithium is contained be sealed to prevent the escape of the vapor.

As shown by Examples I and II, beta SiC single crystals 2 to 3 mm across can easily be grown in a reasonable time at temperatures in the range of 1300° to 1500° C.

EXAMPLE I

Polycrystalline SiC feed material was placed in a molybdenum capsule along with a quantity of lithium such that when molten the lithium would not contact more than half the feed material. The capsule was then vacuum sealed and heated for about one and one-half days at 1330° C. As a result, small (1-2 mm across) beta SiC single crystals precipitated at the bottom of the capsule along with a black residue. The crystals were separated from the residue by reacting the residue first with ethanol and then with water after most of the residue had been removed. The crystals ranged from black to yellow-transparent hexagonal shaped plates.

EXAMPLE II

A new run was made under essentially the same conditions except that the temperature was 1505° C. which was maintained for the same time. The crystals produced were noticeably larger (2-3 mm across) than those produced in the run of Example I.

Although in Examples I and II only high purity chemical vapor deposited polycrystalline SiC was used as the feed material, it will be apparent that it is quite feasible to use as the feed material SiC containing various impurities or doping material such as may be required for use in various semiconductor applications. In particular, the various alkaline earth elements may readily be used as dopants in the process of this invention.

It will be understood that as used in this application the term solvent, unless otherwise specifically stated, refers to lithium in which SiC is either dissolved or undergoes some other form of interaction which, in the presence of excess feed SiC, results in the precipitation of SiC single crystals from the molten lithium.

The foregoing description of a preferred embodiment of the invention has been presented for purposes of illustration and description and is not intended to be exhaustive or to limit the invention to the precise form disclosed. It was chosen and described in order to best explain the principles of the invention and their practical application to thereby enable others skilled in the art to best utilize the invention in various embodiments and with various modifications as are suited to the particular use contemplated. It is intended that the scope of the invention be defined by the claims appended hereto.

What I claim is:

1. In a method of forming SiC single crystals by growth from solution, the improvement comprising using molten lithium as the solvent.

2. The method of claim 1 wherein said solution is maintained at a temperature in the range of about 1330° to about 1500° C.

3. The method of claim 2 wherein said temperature is about 1330° C.

4. A method of forming beta SiC single crystals which comprises holding an excess of polycrystalline SiC in contact with molten lithium at a temperature at which said polycrystalline SiC dissolves in said molten lithium and maintaining the resultant solution at said temperature for a time sufficient for beta SiC single crystals of the desired size to precipitate therefrom.